United States Patent
Cho

(10) Patent No.: US 7,263,114 B2
(45) Date of Patent: Aug. 28, 2007

(54) SEMICONDUCTOR LASER DIODE

(75) Inventor: Soo-haeng Cho, Gyeonggi-do (KR)

(73) Assignee: Samsung Electro-mechanics Co., Ltd., Suwon-si, Gyeonggi-do (KR)

( * ) Notice: Subject to any disclaimer, the term of this patent is extended or adjusted under 35 U.S.C. 154(b) by 251 days.

(21) Appl. No.: 10/989,434

(22) Filed: Nov. 17, 2004

(65) Prior Publication Data

US 2005/0259707 A1    Nov. 24, 2005

(30) Foreign Application Priority Data

May 20, 2004    (KR) .................. 10-2004-0035864

(51) Int. Cl.
*H01S 5/00* (2006.01)
(52) U.S. Cl. .................. 372/45.01; 372/43.01
(58) Field of Classification Search .............. 372/43.01, 372/45.01
See application file for complete search history.

(56) References Cited

U.S. PATENT DOCUMENTS

| | | | |
|---|---|---|---|
| 6,072,817 A * | 6/2000 | Adachi et al. | ......... 372/45.013 |
| 6,160,829 A * | 12/2000 | Sawano | .................... 372/45.01 |
| 6,278,137 B1 * | 8/2001 | Shimoyama et al. | ....... 257/102 |
| 6,487,226 B1 * | 11/2002 | Iwamoto et al. | ......... 372/46.01 |
| 6,563,850 B1 * | 5/2003 | Matsumoto et al. | ..... 372/45.01 |
| 2003/0198268 A1 * | 10/2003 | Jikutani et al. | ................ 372/46 |
| 2004/0066818 A1 * | 4/2004 | Yamamoto et al. | ........... 372/45 |
| 2005/0069004 A1 * | 3/2005 | Watanabe et al. | ............. 372/49 |

OTHER PUBLICATIONS

Soohaeng Cho et al., 600-nm GainP-AlGaInP Quantum-Well Laser Diode Structures With Reduced Vertical Beam Divergence Angle, IEEE Photonics Technology Letters, Mar. 2005, pp. 534-536, vol. 17, No. 3.

* cited by examiner

*Primary Examiner*—Minsun Harvey
*Assistant Examiner*—Phillip Nguyen
(74) *Attorney, Agent, or Firm*—Buchanan Ingersoll & Rooney PC

(57) ABSTRACT

A semiconductor laser diode is provided, including: an active layer; an upper clad layer formed above the active layer; a first lower clad layer formed below the active layer; a second lower clad layer formed under the first lower clad layer; and a substrate formed under the second lower clad layer, wherein a refractive index of the first lower clad layer is identical with a refractive index of the upper clad layer and is lower than a refractive index of the second lower clad layer.

6 Claims, 4 Drawing Sheets

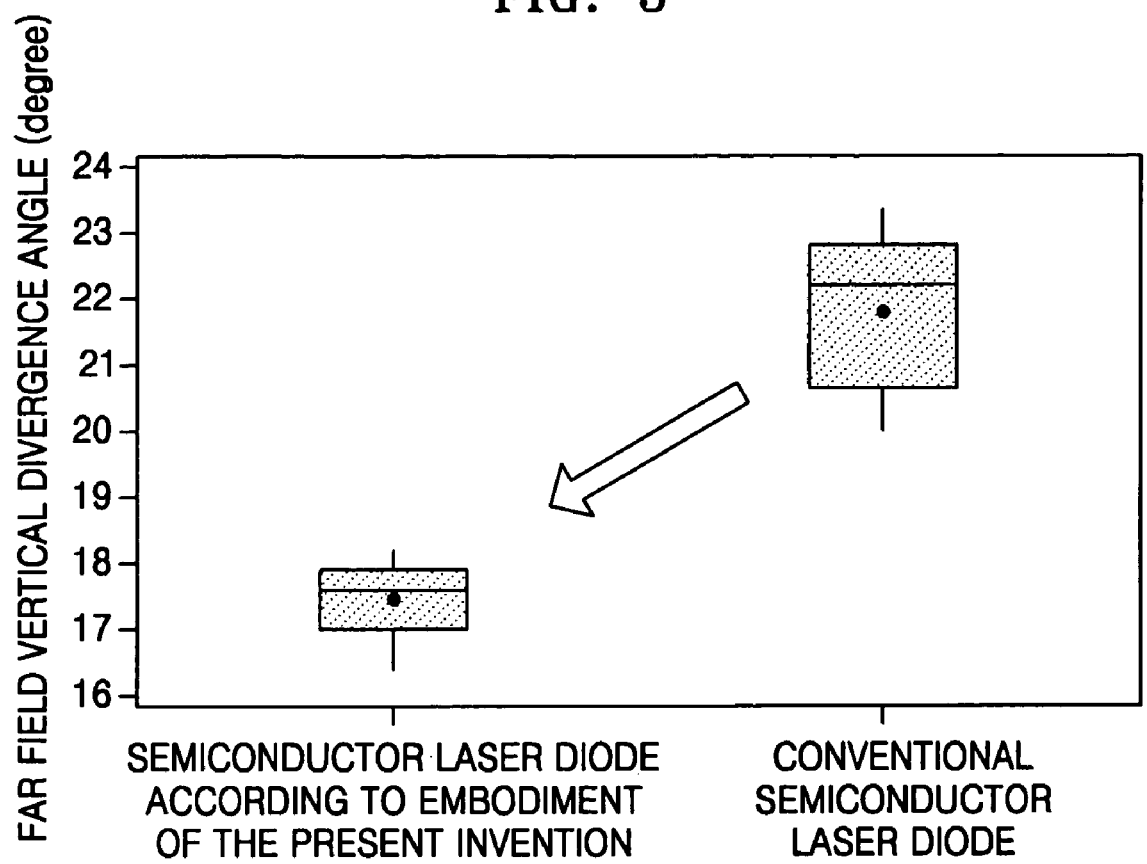

SEMICONDUCTOR LASER DIODE

This application claims the benefit of Korean Patent Application No. 2004-35864, filed on May 20, 2004, in the Korean Intellectual Property Office, the disclosure of which is incorporated herein in its entirety by reference.

BACKGROUND OF THE INVENTION

1. Field of the Invention

The present invention relates to a semiconductor laser diode, and more particularly, to an improved semiconductor laser diode including a clad layer having an asymmetric refractive index.

2. Description of the Related Art

Generally, a semiconductor laser diode has a comparatively small size and a threshold current for laser oscillation, which is less than a threshold current of a general laser device. Therefore, semiconductor laser diodes are widely used as an element for high-speed data recording and reading in a communication field or players in which optical disks are used.

FIG. 1A is a cross-sectional view of a conventional semiconductor laser diode. FIG. 1B illustrates a refractive index profile and optical field distribution of the semiconductor laser diode of FIG. 1A.

Referring to FIGS. 1A and 1B, a conventional semiconductor laser diode has a configuration in which an n-clad layer 11, an n-waveguide layer 12, an active layer 30, a p-waveguide layer 22, and p-clad layers 21 are sequentially deposited on a substrate 10. An etch stop layer to form a ridge is interposed between the p-clad layers 21. A p-electrode layer 40 is formed on the top surface of the p-clad layer 21, and an n-electrode layer 50 is formed on the bottom surface of the substrate 10.

Here, the p-clad layer 21 formed above the active layer 30 and the n-clad layer 11 formed below the active layer 30 have lower refractive indexes $n_{upper}$ and $n_{lower}$, respectively than the refractive index $n_{active}$ of the active layer 30, and the refractive index $n_{upper}$ of the p-clad layer 21 is identical with the refractive index $n_{lower}$ of the n-clad layer 11.

However, in a conventional optical storage device, a semiconductor laser diode is required to have a smaller far field vertical beam divergence angle than approximately 19°. A semiconductor laser diode having a configuration as described above cannot obtain a small far field vertical beam divergence angle if a thin waveguide layer is formed to obtain a large output of power.

A refractive index profile of a semiconductor laser diode including a clad layer having an asymmetric refractive index to solve the problem described above is illustrated in FIG. 2A. Referring to FIG. 2A, a p-clad layer and an n-clad layer are formed on both sides of an active layer respectively, and a refractive index of the n-clad layer is higher than a refractive index of the p-clad layer. Accordingly, the p-clad layer and the n-clad layer have asymmetric refractive indexes with the active layer as a center.

A semiconductor laser diode having the configuration as described above has an advantage to decrease a far field vertical beam divergence angle by dispersing a near field. However, asymmetry of the near field increases significantly which leads to deflection of a laser beam according to an output power as illustrated in FIG. 2B, and potential barrier energy, which is inversely proportional to a refractive index, is reduced in an n-clad layer, thereby suffering more carrier overflow.

SUMMARY OF THE INVENTION

The present invention provides an improved semiconductor laser diode including a clad layer having an asymmetric refractive index.

According to an aspect of the present invention, there is provided a semiconductor laser diode comprising: an active layer; an upper clad layer formed above the active layer; a first lower clad layer formed below the active layer; a second lower clad layer formed under the first lower clad layer; and a substrate formed under the second lower clad layer, wherein a refractive index of the first lower clad layer is identical with a refractive index of the upper clad layer and is lower than a refractive index of the second lower clad layer.

In this case, an etch stop layer may be formed in the upper clad layer.

First and second electrode layers are provided on the top surface of the upper clad layer and the bottom surface of the substrate, respectively.

The active layer may have one of a multiple quantum wells configuration and a single quantum well configuration.

The active layer may be composed of a compound semiconductor of GaInP series.

The upper clad layer may be composed of a compound semiconductor of p-AlGaInP series, and the first and second lower clad layers may be composed of compound semiconductors of n-AlGaInP series.

An upper waveguide layer and a lower waveguide layer may be further formed between the active layer and the upper clad layer and between the active layer and the first lower clad layer, respectively. In this case, the upper waveguide layer and the lower waveguide layer may be composed of compound semiconductors of p-AlGaInP series and n-AlGaInP series, respectively.

BRIEF DESCRIPTION OF THE DRAWINGS

The above and other features and advantages of the present invention will become more apparent by describing in detail exemplary embodiments thereof with reference to the attached drawings in which:

FIG. 5 is a boxplot comparatively illustrating far field vertical beam divergence angles of the semiconductor laser diode according to an embodiment of the present invention and a conventional semiconductor laser diode.

DETAILED DESCRIPTION OF THE INVENTION

Hereinafter, a preferred embodiment of the present invention will now be described with reference to the attached drawings.

A semiconductor laser diode according to an embodiment of the present invention is not restricted to a following embodiment, and other embodiments including other compound semiconductor material of III-V group are possible.

Figure 1A:
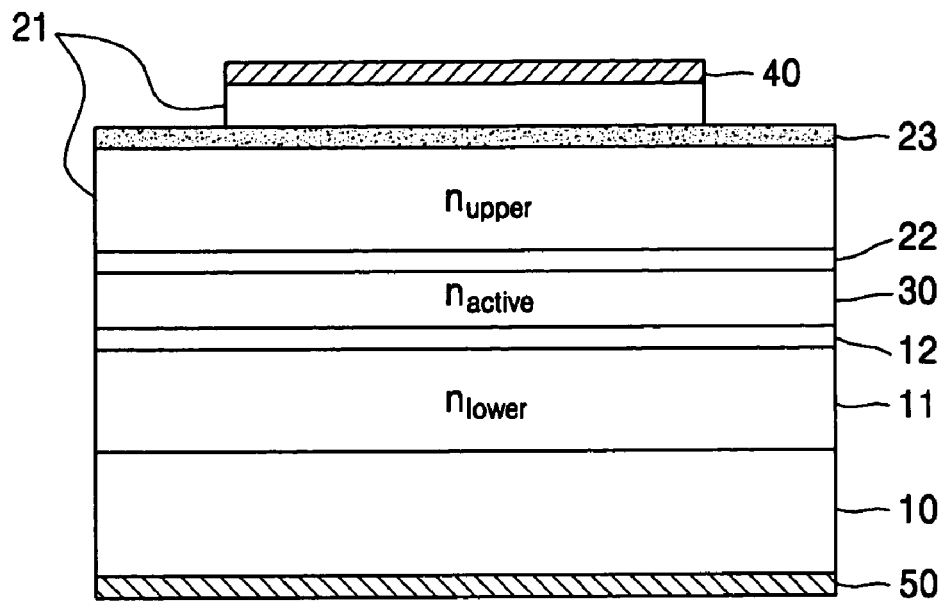
FIG. 1A is a cross-sectional view of a conventional semiconductor laser diode.
Figure 1B:
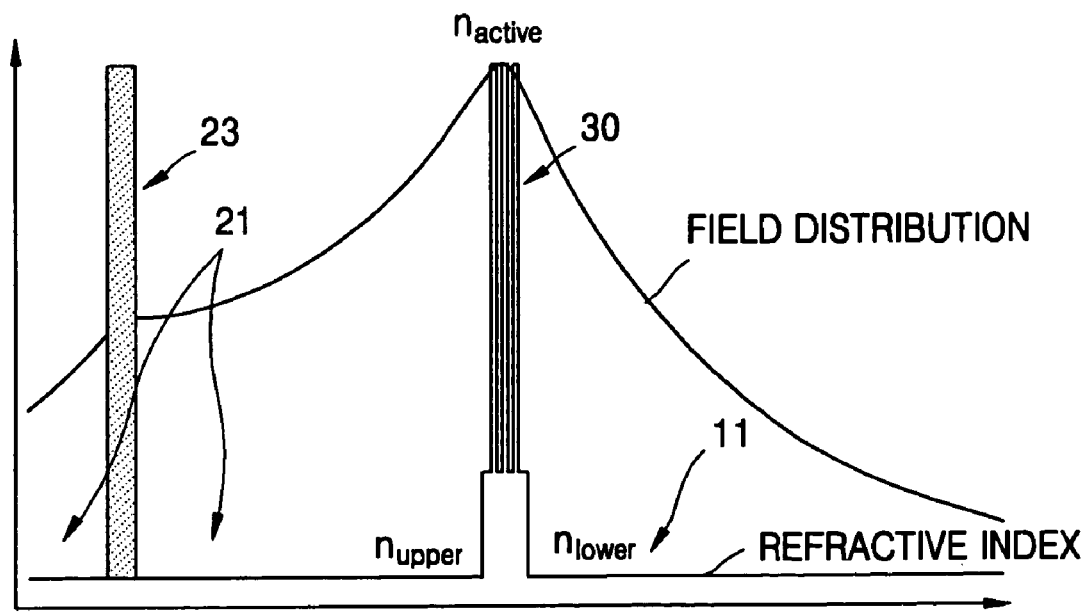
FIG. 1B is a diagram illustrating a refractive index profile and optical field distribution of the semiconductor laser diode of FIG. 1A.
Figure 2A:
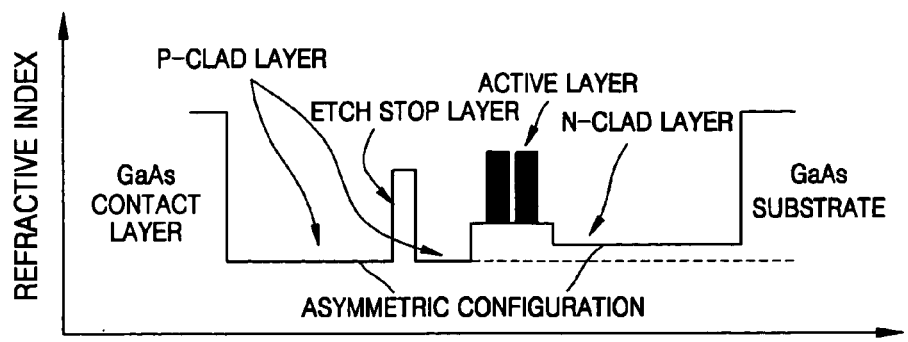
FIG. 2A is diagram illustrating a refractive index profile of another conventional semiconductor laser diode.
Figure 2B:
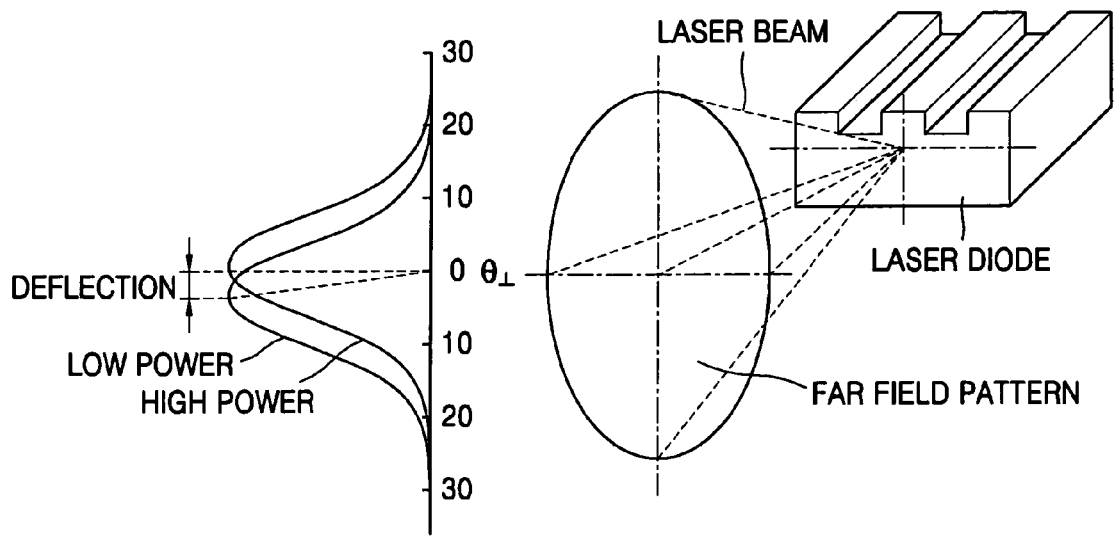
FIG. 2B is a diagram illustrating deflection of a laser beam of the semiconductor laser diode of FIG. 2A.
Figure 3:
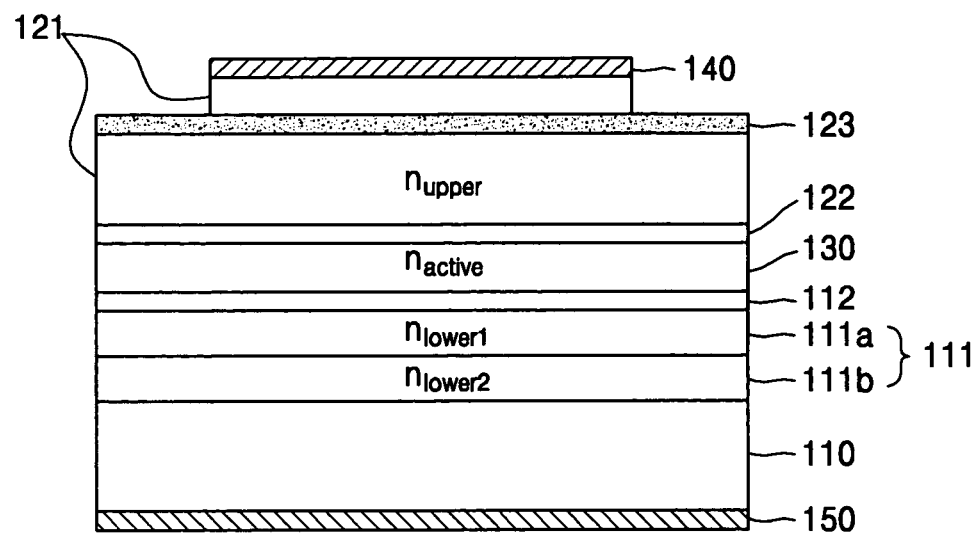
FIG. 3 is a cross-sectional view of a semiconductor laser diode according to an embodiment of the present invention.
Figure 4:
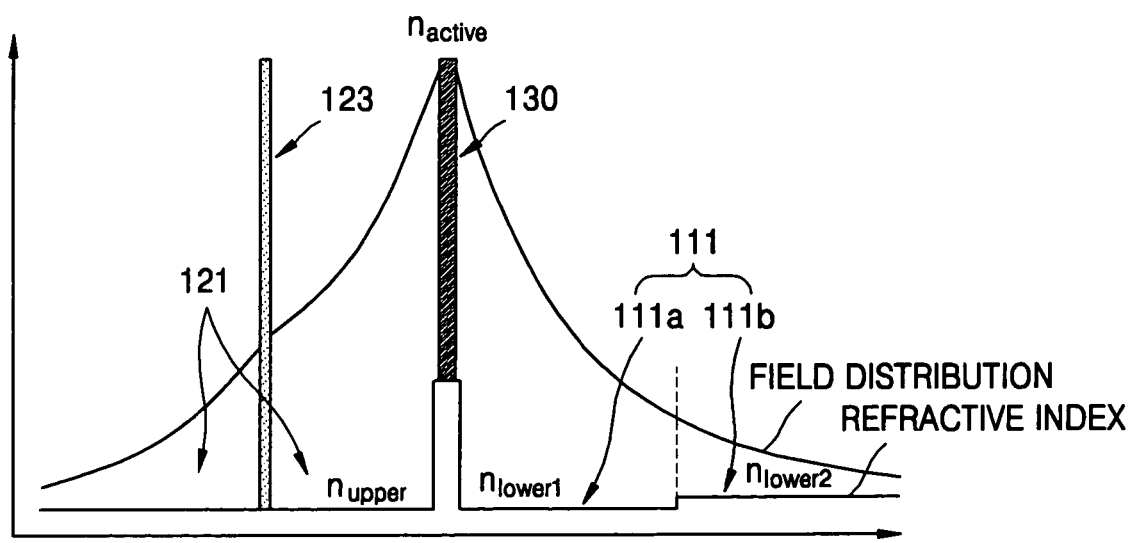
FIG. 4 is a diagram illustrating a refractive index profile and optical field distribution of the semiconductor laser diode of FIG. 3.

FIG. 3 is a cross-sectional view of the semiconductor laser diode according to an embodiment of the present invention. FIG. 4 is a diagram illustrating a refractive index profile and optical field distribution of the semiconductor laser diode of FIG. 3.

Referring to FIGS. 3 and 4, the semiconductor laser diode according to an embodiment of the present invention including a substrate 110 formed of GaAs, and a lower clad layer 111, an active layer 130, and upper clad layers 121 are sequentially deposited on the substrate 110. Here, the lower clad layer 111 is composed of a first lower clad layer 111a and a second lower clad layer 111b. On the other hand, a lower waveguide layer 112 can be formed between the active layer 130 and the first lower clad layer 111a, and an upper waveguide 122 can be formed between the active layer 130 and the upper clad layer 121. A first electrode layer 140 and a second electrode layer 150 are formed on the top surface of the upper clad layer 121 and the bottom surface of the substrate 110, respectively.

A refractive index $n_{lower2}$ of the second lower clad layer 111b is higher than a refractive index $n_{lower\,1}$ of the first lower clad layer 111a, and the second lower clad layer 111b is formed of a compound semiconductor layer. For the sake of this, the second lower clad layer 111b formed on the substrate 110 can be composed of n-$(Al_{0.68}Ga_{0.32})_{0.5}In_{0.5}P$ compound semiconductor, and the first lower clad layer 111a formed on the second lower clad layer 111b can be composed of n-$(Al_{0.7}Ga_{0.3})_{0.5}In_{0.5}P$ compound semiconductor. The first and second lower clad layer 111a and 111b can be formed by epitaxially growing a compound semiconductor of AlGaInP series on the substrate 110 to change the amount of Al. On the other hand, the first and second lower clad layer 111a and 111b can be composed of another compound semiconductor of III-V group.

The lower waveguide layer 112, the active layer 130, and the upper waveguide layer 122 are sequentially formed on the top surface of the first lower clad layer 111a. Here, the lower waveguide layer 112 and the upper waveguide layer 122, which guide laser oscillation are formed of compound semiconductor layers having refractive indexes which are higher than refractive indexes of the lower and upper clad layers 111 and 121. For the sake of this, the lower waveguide layer 112 and the upper waveguide layer 122 can be composed of n-$(Al_{0.5}Ga_{0.5})_{0.5}In_{0.5}P$ compound semiconductor and p-$(Al_{0.5}Ga_{0.5})_{0.5}In_{0.5}P$ compound semiconductor, respectively.

The active layer bringing about laser oscillation is formed of a compound semiconductor layer having a refractive index $n_{active}$ which is higher than the refractive indexes of the lower and upper waveguide layer 112 and 122. For the sake of this, the active layer 130 is composed of $Ga_{0.5}In_{0.5}P$ compound semiconductor. Here, the active layer 130 has a configuration of a multiple quantum well or a single quantum well.

The upper clad layer 121 formed on the top surface of the upper waveguide layer 122 is formed of a compound semiconductor layer having a refractive index $n_{upper}$ identical with the refractive index $n_{lower1}$ of the first lower clad layer 111a. For the sake of this, the upper clad layer 121 can be composed of p-$(Al_{0.7}Ga_{0.3})_{0.5}In_{0.5}P$ compound semiconductor. On the other hand, an etch stop layer 123 may be formed in the upper clad layer 121 and when the upper portion of the upper clad layer 121 is etched to form a ridge, the etch stop layer 123 is required to accurately form a ridge having a designated height.

The first electrode layer 140 that is a p-electrode layer is formed on the top surface of the upper clad layer 121, and the second electrode 150 that is an n-electrode layer is formed on the bottom surface of the substrate 110.

As described above, in the semiconductor laser diode according to an embodiment of the present invention, the lower clad layer 111 is divided into the first and second lower clad layers 111a and 111b, the refractive index $n_{lower2}$ of the second clad layer 111b is greater than the refractive index $n_{lower1}$ of the first lower clad layer 111a, the refractive index $n_{lower1}$ of the first lower clad layer 111a is identical with the refractive index $n_{upper}$ of the upper clad layer. As described above, when the upper and lower clad layers 121 and 111 have asymmetric refractive indexes with the active layer 130 as a center, thereby dispersing a near field to reduce a far field vertical beam divergence angle. Also, because of the first lower clad layer 111a having a refractive index identical with a refractive index of the upper clad layer 121, a reduction level of an optical confinement factor can be comparatively decreased, after all, an unavoidable rate of increase of a threshold current according to a beam divergence angle increase can be comparatively decreased. Also, distinctively from a conventional refractive index asymmetric configuration, because the refractive index of the first lower clad layer 111a is identical with the refractive index of the upper clad layer 121. Therefore, deflection of a laser beam can be prevented, and since potential barrier energy of the first lower clad layer 111a is not reduced, the confinement of a carrier is effectively performed.

Table 1 and FIG. 5 are a table and a boxplot, respectively, in which experimental values of far field vertical beam divergence angles of a conventional semiconductor laser diode, including upper and lower clad layers having symmetric refractive indexes and a semiconductor laser diode according to an embodiment of the present invention, including upper and lower clad layers having asymmetric refractive indexes, are comparatively shown.

TABLE 1

| | Average value of far field vertical beam divergence angle (in degrees) | Standard deviation |
|---|---|---|
| Conventional semiconductor laser diode | 21.80° | 1.19 |
| Semiconductor laser diode according to an embodiment of the present invention | 17.48° | 0.66 |

Referring to Table 1 and FIG. 5, an average value of a far field vertical beam divergence angle of a conventional semiconductor laser diode is 21.80°, and an average value of a far field vertical beam divergence angle of a semiconductor laser diode according to an embodiment of the present invention is 17.48°. Accordingly, the far field vertical beam divergence of the semiconductor laser diode according to an embodiment of the present invention is reduced approximately 20% from the far field vertical beam divergence of the conventional semiconductor laser diode.

As described above, the semiconductor laser diode according to an embodiment of the present invention has following advantages.

First, since upper and lower clad layers have asymmetric refractive indexes with an active layer as a center, a far field vertical beam divergence angle is reduced by dispersion of a near field.

Second, since a lower clad layer of two lower clad layers, which is adjacent to an active layer, has the same refractive index of an upper clad layer, reduction of optical confinement factor is comparatively decreased, after all, a threshold current can be reduced.

Third, since potential barrier energy of a lower clad layer is not reduced, the confinement of a carrier is more effectively performed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor laser diode comprising:
    an active layer, wherein the active layer is composed of a compound semiconductor of GaInP series;
    an upper clad layer formed above the active layer, wherein the upper clad layer is composed of p-$(Al_{0.7}Ga_{0.3})_{0.5}In_{0.5}P$;
    a first lower clad layer formed below the active layer;
    a second lower clad layer formed under the first lower clad layer; and
    a substrate formed beneath the second lower clad layer,
    wherein a refractive index of the first lower clad layer is identical with a refractive index of the upper clad layer and is lower than a refractive index of the second lower clad layer and wherein the first and second lower clad layers are composed of compound semiconductors of n-AlGaInP series and wherein the second lower clad layer is composed of n-$(Al_{0.68}Ga_{0.32})_{0.5}In_{0.5}P$.

2. The semiconductor laser diode of claim 1, wherein an etch stop layer is formed in the upper clad layer.

3. The semiconductor laser diode of claim 1, wherein first and second electrode layers are provided on the top surface of the upper clad layer and the bottom surface of the substrate, respectively.

4. The semiconductor laser diode of claim 1, wherein the active layer has one of multiple quantum well structures and a single quantum well structure.

5. The semiconductor laser diode of claim 1, wherein an upper waveguide layer and a lower waveguide layer are further formed between the active layer and the upper clad layer and between the active layer and the first lower clad layer, respectively.

6. The semiconductor laser diode of claim 1, wherein the upper waveguide layer and the lower waveguide layer are composed of compound semiconductors of p-AlGaInP series and n-AlGaInP series, respectively.

* * * * *